(12) United States Patent
Sakai et al.

(10) Patent No.: US 11,271,338 B2
(45) Date of Patent: Mar. 8, 2022

(54) ELECTRICAL CONNECTION ASSEMBLY AND ELECTRICAL APPARATUS

(71) Applicants: Tyco Electronics Japan G.K., Kawasaki (JP); Tyco Electronics (Shanghai) Co. Ltd., Shanghai (CN)

(72) Inventors: Ken Sakai, Kawasaki (JP); Pai R. Rajendra, Shanghai (CN); Yulin Feng, Shanghai (CN); Lei Pan, Shanghai (CN); Tian Xia, Shanghai (CN)

(73) Assignees: Tyco Electronics Japan G.K., Kawasaki (JP); Tyco Electronics (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 16/858,615

(22) Filed: Apr. 25, 2020

(65) Prior Publication Data
US 2020/0343664 A1    Oct. 29, 2020

(30) Foreign Application Priority Data

Apr. 25, 2019   (CN) .......................... 201910340462.0

(51) Int. Cl.
*H01R 13/24* (2006.01)
*F25D 27/00* (2006.01)
*H01R 33/18* (2006.01)
*H01R 12/70* (2011.01)

(52) U.S. Cl.
CPC ............. *H01R 13/24* (2013.01); *F25D 27/00* (2013.01); *H01R 33/18* (2013.01); *H01R 12/707* (2013.01); *H01R 12/7052* (2013.01)

(58) Field of Classification Search
CPC ......... F21W 2131/301; H01R 12/7064; H01R 12/737; F21V 23/06; F25D 25/024; F25D 2400/40; F21Y 2115/10; H05K 3/366; H05K 2201/10189; H05K 1/184
See application file for complete search history.

(56) References Cited

U.S. PATENT DOCUMENTS

| 4,811,168 | A | * | 3/1989 | Chesnut | ............... | H05K 5/0247 |
| | | | | | | 361/736 |
| 7,357,665 | B1 | | 4/2008 | Yan | | |
| 8,231,417 | B2 | * | 7/2012 | Zhu | ..................... | H01R 12/716 |
| | | | | | | 439/862 |

(Continued)

FOREIGN PATENT DOCUMENTS

| CN | 107134673 A | 9/2017 |
| DE | 20107605 U1 | 7/2001 |

(Continued)

OTHER PUBLICATIONS

Extended European Search Report, dated Sep. 23, 2020, 8 pages.
(Continued)

*Primary Examiner* — Jean F Duverne
(74) *Attorney, Agent, or Firm* — Barley Snyder

(57) ABSTRACT

An electrical connection assembly includes a circuit board and a connector mounted on the circuit board. The connector has a housing and a contact received in the housing. The contact has an elastic arm extending out from a surface of the housing and a connection pin extending out from a side face of the housing. The elastic arm electrically contacts an electrical contact pad on a moving bracket and the connection pin electrically contacts the circuit board.

16 Claims, 7 Drawing Sheets

(56) References Cited

U.S. PATENT DOCUMENTS

| | | |
|---|---|---|
| 2011/0287641 A1 | 11/2011 | Zhu |
| 2012/0052733 A1 | 3/2012 | Zhu |
| 2012/0156903 A1 | 6/2012 | Kim |
| 2014/0183015 A1* | 7/2014 | Saomoto ............... H01H 13/10 200/247 |
| 2014/0227893 A1 | 8/2014 | Howard |

FOREIGN PATENT DOCUMENTS

| | | |
|---|---|---|
| DE | 102009002502 A1 | 10/2010 |
| EP | 0902994 A1 | 3/1999 |
| EP | 0902994 B1 | 11/2001 |
| EP | 2822102 A1 | 1/2015 |
| JP | 201289773 A | 5/2012 |

OTHER PUBLICATIONS

Chinese Office Action, App. No. 2019103404620, dated Apr. 28, 2021, 8 pages.
Abstract of CN 107134673, dated Sep. 5, 2017, 1 pages.

\* cited by examiner

ELECTRICAL CONNECTION ASSEMBLY AND ELECTRICAL APPARATUS

CROSS-REFERENCE TO RELATED APPLICATION

This application claims the benefit of the filing date under 35 U.S.C. § 119(a)-(d) of Chinese Patent Application No. 201910340462.0, filed on Apr. 25, 2019.

FIELD OF THE INVENTION

The present invention relates to an electrical connection assembly and, more particularly, to an electrical connection assembly including a connector mounted on a circuit board.

BACKGROUND

In a household appliance, some electrical loads are installed on a moving part, for example, LED lamps installed on a moving shelf in a refrigerator. In the prior art, it is necessary to provide a connector on a circuit board and a mating connector on the moving shelf. After the moving shelf is inserted into the refrigerator, the connector on the circuit board is mated with the mating connector on the moving shelf, so that the circuit board is electrically connected to the LED lamp on the moving shelf by the connector and the mating connector to supply power to the LED lamp.

It is necessary to provide a connector on the moving shelf, which increases the cost. Furthermore, the connector provided on the moving shelf may be damaged during inserting the moving shelf into the refrigerator, which may result in a failure of an electrical connection.

SUMMARY

An electrical connection assembly includes a circuit board and a connector mounted on the circuit board. The connector has a housing and a contact received in the housing. The contact has an elastic arm extending out from a surface of the housing and a connection pin extending out from a side face of the housing. The elastic arm electrically contacts an electrical contact pad on a moving bracket and the connection pin electrically contacts the circuit board.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
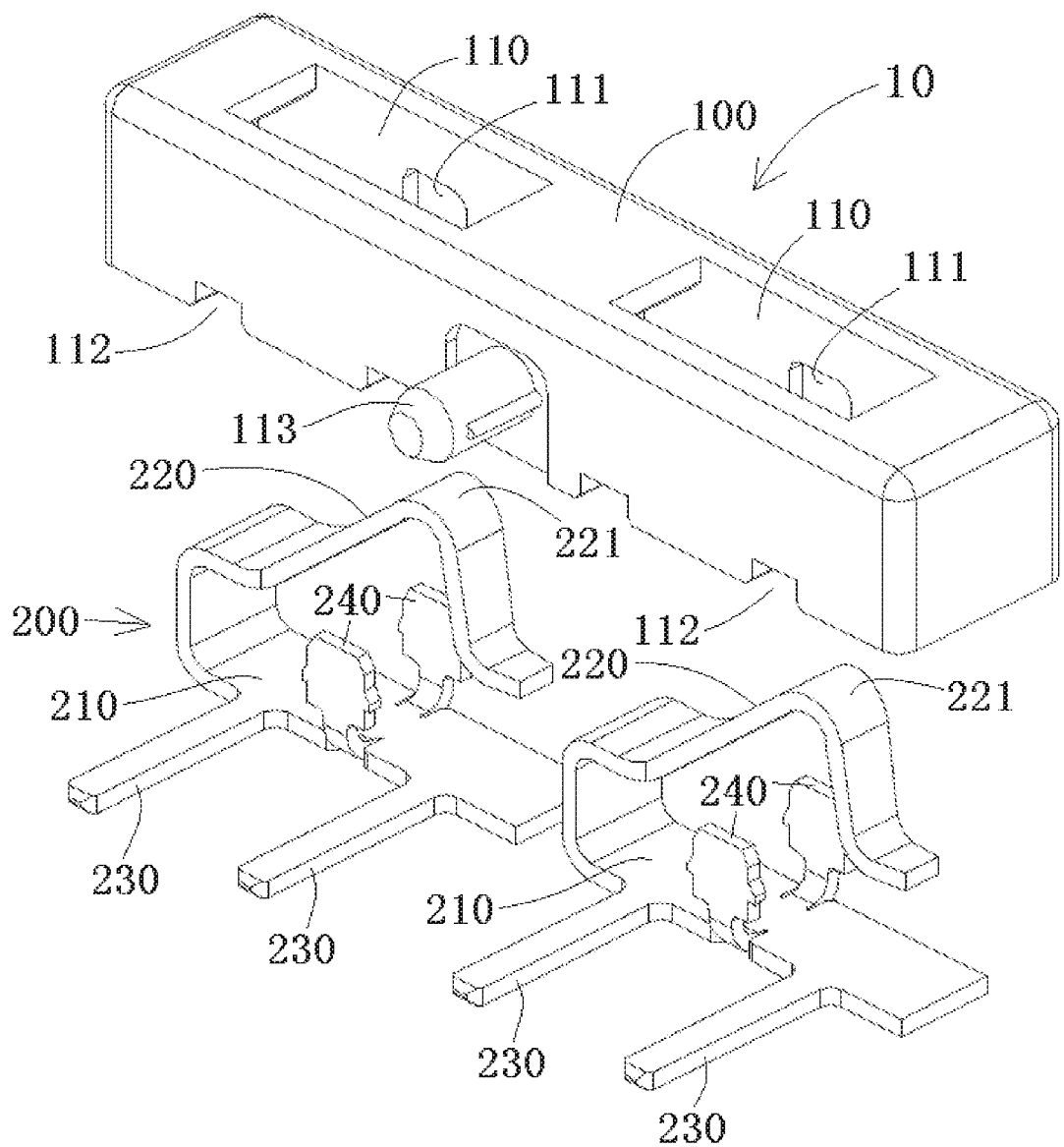
FIG. 1 is an exploded perspective view of a connector according to an embodiment.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiments set forth herein; rather, these embodiments are provided so that the present disclosure will convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 4:
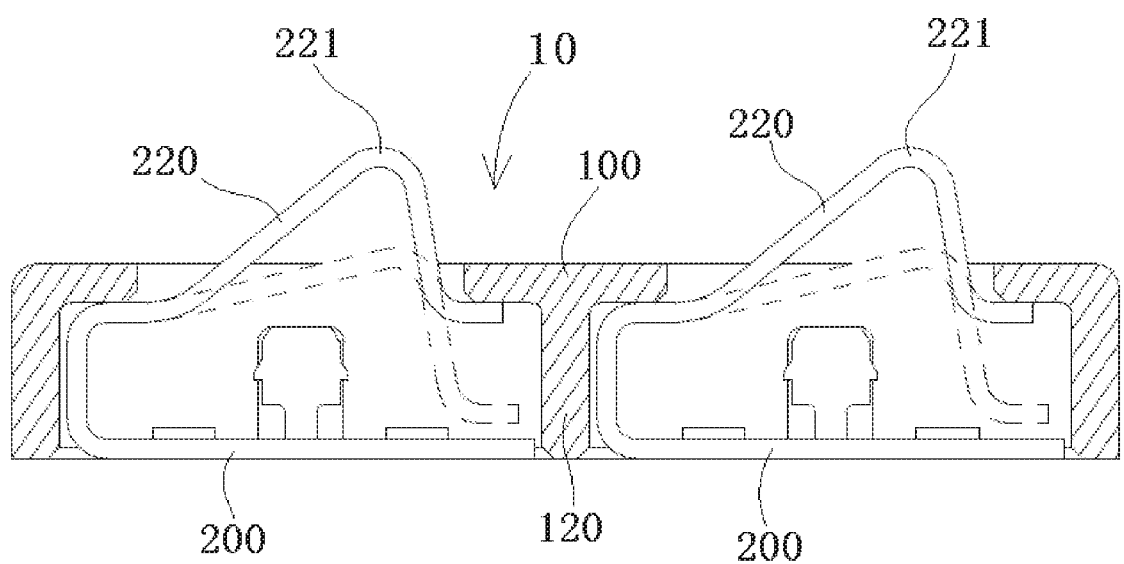
FIG. 4 is a sectional side view of the connector.
Figure 5:
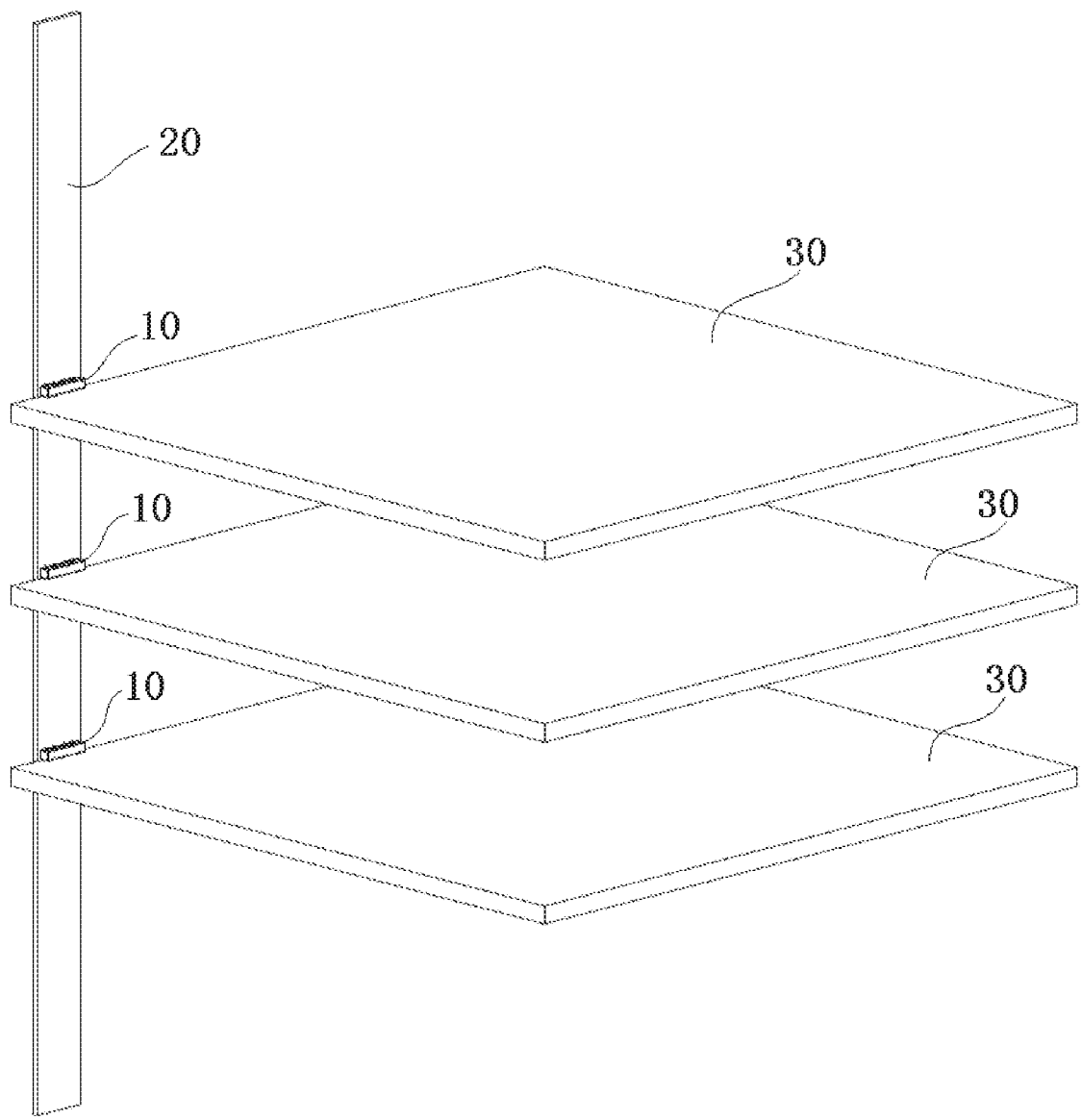
FIG. 5 is a perspective view of an electrical connection assembly according to an embodiment.
Figure 6:
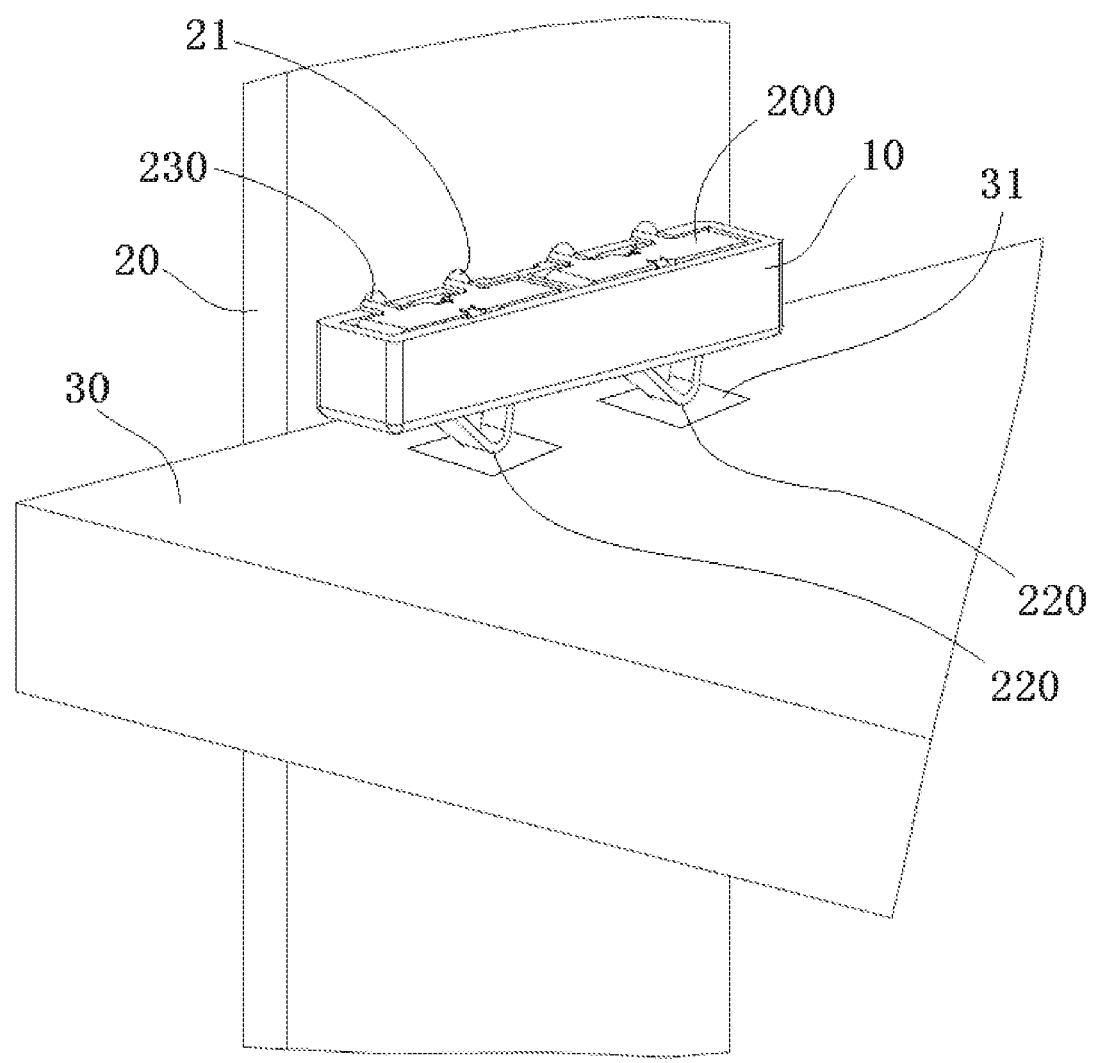
FIG. 6 is a perspective view of a connector, a moving bracket, and a front side of a circuit board of the electrical connection assembly.
Figure 7:
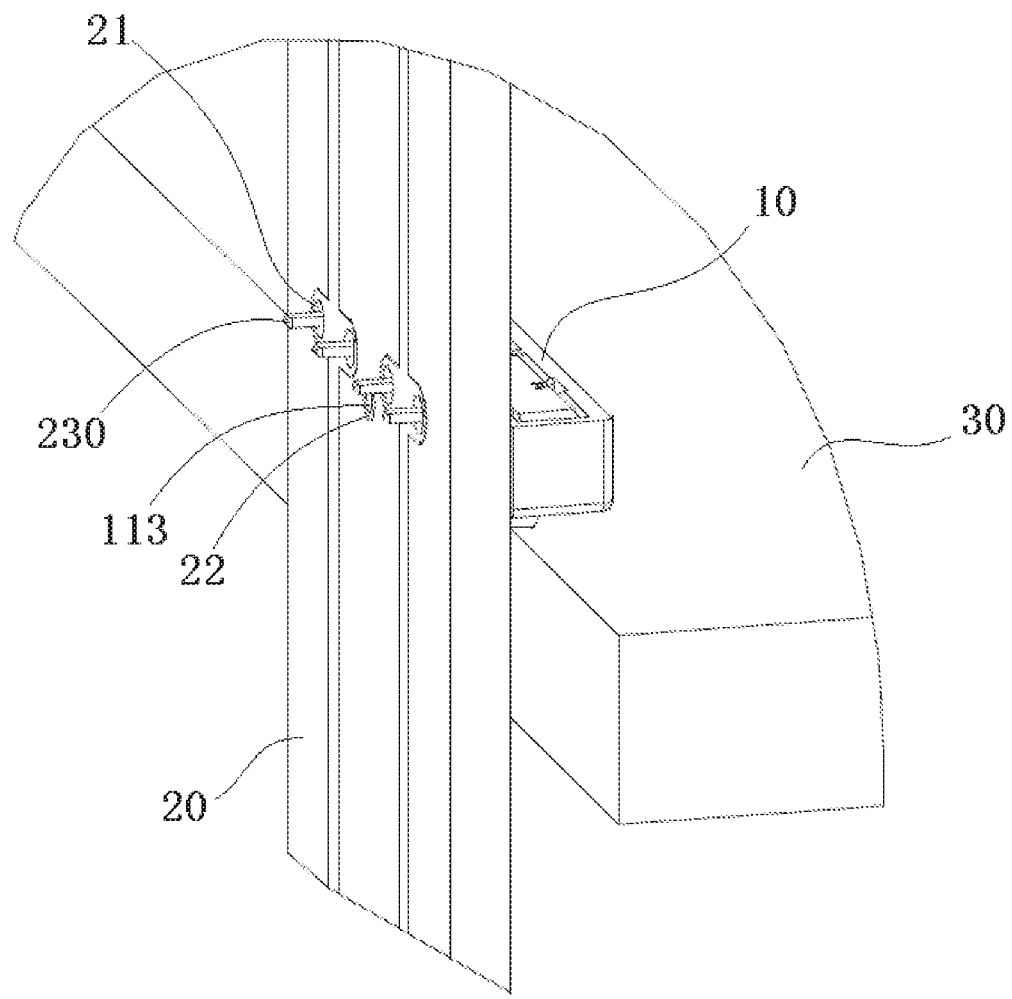
FIG. 7 is a perspective view of the connector, the moving bracket, and a back side of the circuit board of the electrical connection assembly.

An electrical connection assembly according to an embodiment, as shown in FIGS. 5-7, comprises a circuit board 20 and at least one connector 10 mounted on the circuit board 20. Each connector 10, as shown in FIGS. 1-4, comprises a housing 100 and at least one contact 200 received in the housing 100.

Each contact 200, as shown in FIGS. 1-4, has an elastic arm 220 and a connection pin 230. The elastic arm 220 extends out from a surface of the housing 100 to make electrical contact with an electrical contact pad 31 formed on a moving bracket 30, as shown in FIG. 6. The elastic arm 220 of the contact 200 has an arc contact portion 221 protruding outward, and the arc contact portion 221 is adapted to make electrical contact with the electrical contact pad 31 on the moving bracket 30. The connection pin 230 extends out from a side face of the housing 100 to electrically connect with the circuit board 20.

As shown in FIG. 5, in an embodiment, a plurality of connectors 10 are mounted on the circuit board 20. The plurality of connectors 10 are separated from each other in a first direction for electrically connecting the electrical contact pads 31 on a plurality of moving brackets 30, respectively. In the embodiment shown in FIG. 5, the plurality of connectors 10 are arranged in a column along the first direction on the circuit board 20.

As shown in FIGS. 5-7, the surface of the housing 100 is configured to be perpendicular to the circuit board 20, and the elastic arm 220 extends out from the surface of the housing 100. The side face of the housing 100 is configured to be parallel to the circuit board 20, and the connection pin 230 extends out from the side face of the housing 100.

In the embodiment shown in FIGS. 5-7, the circuit board 20 is vertically arranged. The circuit board 20 is in a vertical plane. The surface of the housing 100 is in a horizontal plane. Thereby, the circuit board 20 is perpendicular to the surface of the housing 100 and parallel to the side face of the housing 100.

In the embodiment shown in FIGS. 1-7, the connector 10 is a power supply connector, and each connector 10 includes two contacts 200. Two electrical contact pads 31 are formed on a surface of the moving bracket 30, and the two electrical contact pads 31 served as two electrode terminals of an electrical load mounted on the moving bracket 30. The elastic arms 220 of the two contacts 200 of the connector 10 are adapted to make electrical contact with the two electrical contact pads 31 of the moving bracket 30, respectively, so as to connect the electrical load on the moving bracket 30 to the circuit board 20 to power the electrical load.

As shown in FIGS. 1-4, at least one chamber 110 is formed in the housing 100, the at least one contact 200 is received in the at least one chamber 110, respectively. In the shown embodiment, two chambers 110 are formed in the housing 100 and isolated from each other by a separation wall 120. The two contacts 200 of the connector 10 are received in the two chambers 110, respectively.

As shown in FIGS. 1-4, each contact 200 has a base plate 210. The elastic arm 220 is connected to an end of the base plate 210, and the connection pin 230 is connected to a side of the base plate 210. Each contact 200 has a pair of side wings 240 connected to both sides of the base plate 210, respectively. Two slots 111 corresponding to the pair of side wings 240 are formed in both inner sidewalls of the chamber 110 of the housing 100, and/or the side wings 240 are inserted into the slots 111 in an interference fit to fix the contact 200 in the housing 100.

Figure 2:
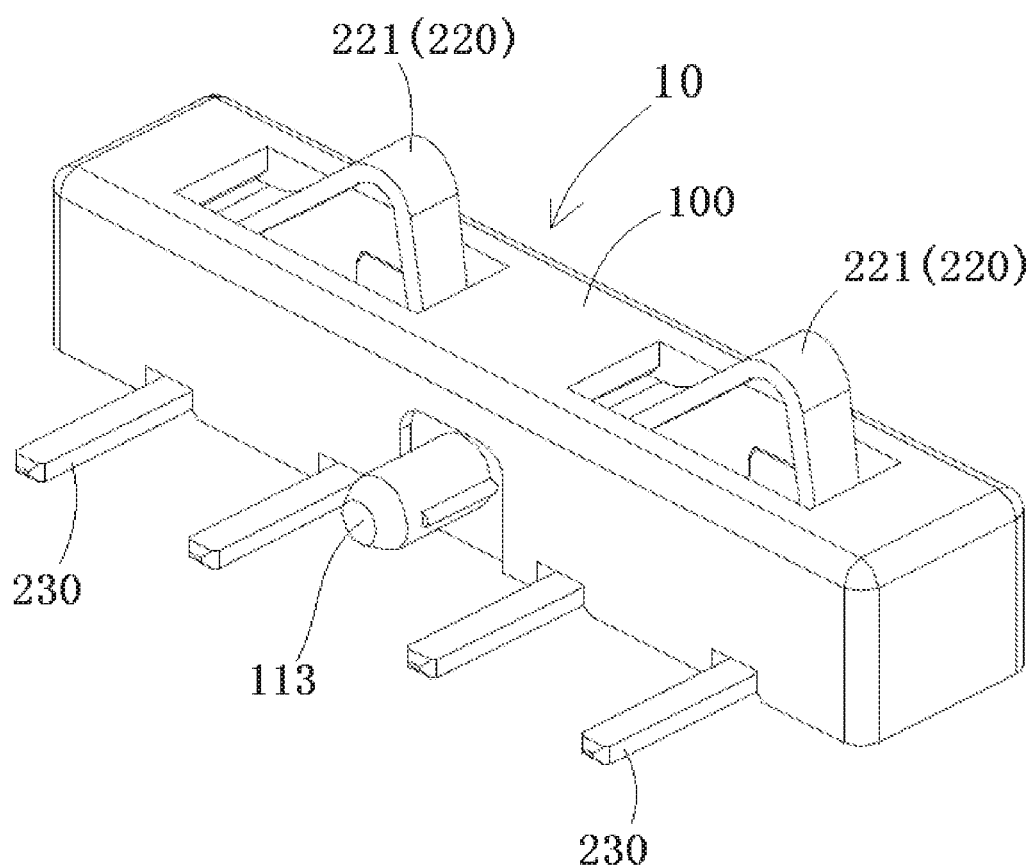
FIG. 2 is a top perspective view of the connector.
Figure 3:
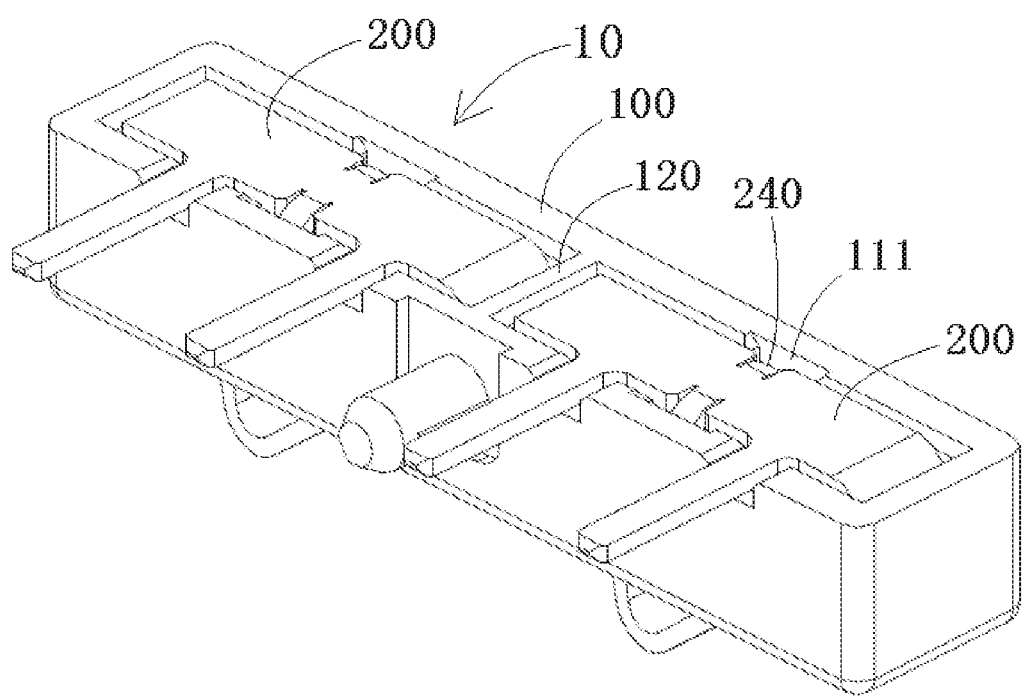
FIG. 3 is a bottom perspective view of the connector.

As shown in FIGS. 1-3, a positioning slot 112 corresponding to the connection pin 230 is formed in the housing 100, and/or the connection pin 230 passes through the positioning slot 112 and is positioned in the positioning slot 112.

As shown in FIGS. 6 and 7, a hole 21 corresponding to the connection pin 230 is formed in the circuit board 20, and/or the connection pin 230 is inserted into the hole 21 and soldered to the circuit board 20.

As shown in FIGS. 1, 2, and 7, in an embodiment, a positioning post 113 is formed on the side face of the housing 100, a positioning hole 22 corresponding to the positioning post 113 is formed in the circuit board 20, and/or the positioning post 113 is inserted into the positioning post 113 in an interference fit to fix the housing 100 to the circuit board 20.

In an embodiment, an electrical apparatus comprises the electrical connection assembly shown in FIGS. 5-7, the moving bracket 30, and an electrical load. The electrical connection assembly may be fixed in the electrical apparatus. The moving bracket 30 is adapted to be inserted into the electrical apparatus. The electrical load is mounted on the moving bracket 30 and moved with the moving bracket 30.

As shown in FIG. 6, the electrical contact pad 31 serving as an electrode terminal of the electrical load is formed on a surface of the moving bracket 30. In this case, when the moving bracket 30 is inserted into the electrical apparatus, the electrical contact pad 31 on the moving bracket 30 electrically contacts the contact 200 of the connector 10 of the electrical connection assembly. In this way, the electrical load on the moving bracket 30 is electrically connected to the circuit board 20, so as to power the electrical load.

As shown in FIG. 4, before the moving bracket 30 is inserted into the electrical apparatus, the elastic arm 220 of the contact 200 of the connector is not pressed by the moving bracket 30 and is located at an initial position shown by the solid line. After the moving bracket 30 is inserted into the electrical apparatus, the elastic arm 220 of the contact 200 of the connector is pressed by the moving bracket 30 and is moved to a working position shown by the dotted line.

The circuit board 20, as shown in FIGS. 5-7, is vertically provided in the electrical apparatus, and a plurality of connectors 10 are mounted on the circuit board 20 and separated from each other in a vertical direction. The electrical apparatus includes a plurality of moving brackets 30 each adapted to be inserted into the electrical apparatus in a horizontal direction. The plurality of connectors 10 are adapted to make electrical contact with the electrical contact pads 31 on the plurality of moving brackets 30, respectively.

In an embodiment, the electrical load may comprise an LED lamp embedded in the moving bracket 30.

In an embodiment, the electrical apparatus may comprise a refrigerator, and the moving bracket 30 may be a moving shelf of the refrigerator for placing objects thereon. The moving bracket 30 may be supported by supporters formed in the refrigerator. In other embodiments, the electrical apparatus may be other electrical devices.

In an embodiment, because the moving bracket 30 does not have a separate connector mounted thereon, it can be washed.

In an embodiment, if the position of the holes 21 in the circuit board 20 is changed in the first direction, an interval between adjacent connectors 10 is changed so that an interval between adjacent moving brackets 30 can be changed.

The electrical load on the moving bracket 30 may be electrically connected to the circuit board 20 by the electrical contact pad 31 on the moving bracket 30 without a need to provide a connector 10 on the moving bracket 30, which reduces the cost, and is very convenient to use.

It should be appreciated for those skilled in this art that the above embodiments are intended to be illustrative, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. An electrical connection assembly, comprising:
   a circuit board;
   a plurality of connectors mounted on the circuit board and separated from each other in a first direction, each connector has a housing and a contact received in the housing, the contact has an elastic arm extending out from a surface of the housing and a connection pin extending out from a side face of the housing contacting the circuit board, the surface of the housing being perpendicular to the circuit board and the side face of the housing being parallel to the circuit board; and
   a plurality of moving brackets, each moving bracket including an electrical contact pad, the elastic arm of each contact electrically contacts the electrical contact pad on a respective moving bracket.

2. The electrical connection assembly of claim 1, wherein the plurality of connectors are arranged in a column on the circuit board along the first direction.

3. The electrical connection assembly of claim 1, wherein the first direction is parallel to the circuit board and perpendicular to the surface of the housing.

4. The electrical connection assembly of claim 1, wherein the connector is a power supply connector and the contact is one of a pair of contacts of the connector.

5. The electrical connection assembly of claim 3, wherein the moving bracket has a pair of electrical contact pads on a surface of the moving bracket, the electrical contact pads are a pair of electrode terminals of an electrical load mounted on the moving bracket.

6. The electrical connection assembly of claim 4, wherein the elastic arm of each of the pair of contacts electrically contacts one of the electrical contact pads of the moving bracket, connecting the electrical load to the circuit board to power the electrical load.

7. The electrical connection assembly of claim 1, wherein the housing has a chamber receiving the contact.

8. The electrical connection assembly of claim 7, wherein the contact has a base plate, the elastic arm is connected to an end of the base plate and the connection pin is connected to a side of the base plate.

9. The electrical connection assembly of claim 8, wherein the contact has a pair of side wings connected to a pair of sides of the base plate, the chamber has a pair of slots corresponding to the side wings formed in a pair of inner sidewalls of the chamber, each of the side wings is inserted into one of the slots in an interference fit to fix the contact in the housing.

10. The electrical connection assembly of claim 8, wherein the housing has a positioning slot corresponding to the connection pin, the connection pin passes through the positioning slot and is positioned in the positioning slot.

11. The electrical connection assembly of claim 1, wherein the circuit board has a hole corresponding to the connection pin, the connection pin is inserted into the hole and soldered to the circuit board.

12. The electrical connection assembly of claim 1, wherein the side face of the housing defines a positioning post, the positioning post is inserted into a positioning hole formed in the circuit board in an interference fit to fix the housing to the circuit board.

13. The electrical connection assembly of claim 1, wherein the elastic arm has an arc contact portion protruding outward, the arc contact portion electrically contacts the electrical contact pad.

14. An electrical apparatus, comprising:
a plurality of moving shelves adapted to be inserted into the electrical apparatus in a horizontal direction;
an electrical load mounted on each moving shelf, the electrical load has an electrical contact pad formed on a surface of the moving shelf and serving as an electrode terminal of the electrical load; and
an electrical connection assembly fixed in the electrical apparatus, the electrical connection assembly including a circuit board mounted vertically in the apparatus and a plurality of connectors mounted on the circuit board and separated from each other in a vertical direction, each connector has a housing and a contact received in the housing, the contact has an elastic arm extending out from a surface of the housing and a connection pin extending out from a side face of the housing, the connection pin electrically contacts the circuit board, the elastic arm electrically contacts the electrical contact pad of a respective moving shelf when the moving shelf is inserted into the electrical apparatus.

15. The electrical apparatus of claim 14, wherein the electrical load is an LED lamp embedded in the moving bracket.

16. The electrical apparatus of claim 14, wherein the electrical apparatus is a refrigerator and the moving shelf is a moving shelf of the refrigerator for placing objects thereon.

* * * * *